United States Patent
Yen

(10) Patent No.: US 10,340,880 B2
(45) Date of Patent: Jul. 2, 2019

(54) STRUCTURES OF PLANAR TRANSFORMER AND BALANCED-TO-UNBALANCED TRANSFORMER

(71) Applicant: Realtek Semiconductor Corporation, Hsinchu (TW)

(72) Inventor: Hsiao-Tsung Yen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 1 day.

(21) Appl. No.: 15/150,126

(22) Filed: May 9, 2016

(65) Prior Publication Data
US 2017/0012601 A1    Jan. 12, 2017

(30) Foreign Application Priority Data

Jul. 7, 2015   (TW) .............................. 104121971 A

(51) Int. Cl.
*H01F 27/28* (2006.01)
*H01F 5/00* (2006.01)
(Continued)

(52) U.S. Cl.
CPC .............. *H03H 7/42* (2013.01); *H01F 27/28* (2013.01); *H01F 27/288* (2013.01); *H01L 23/5227* (2013.01)

(58) Field of Classification Search
CPC ............ H01F 27/2804; H01F 17/0006; H01F 41/041; H03F 1/565
(Continued)

(56) References Cited

U.S. PATENT DOCUMENTS 3,274,396 A * 9/1966 Eubanks .................. H03K 3/45
307/421
3,310,764 A * 3/1967 Kilpatrick ................ H05H 7/04
315/503
(Continued)

FOREIGN PATENT DOCUMENTS

CN    102403097 A    4/2012
CN    104769687 A    7/2015

OTHER PUBLICATIONS

State Intellectual Property Office of the People's Republic of China, "Office Action", dated Jan. 2, 2018. The OA letter, mailed on Jan. 2, 2018, recites that the cited reference renders claims 1, 3, 9, 11 and 14 anticipated and claims 2, 4-8, 10, 12-13, 15 and 18-24 obvious.
(Continued)

Primary Examiner — Alexander Talpalatski
Assistant Examiner — Joselito Baisa
(74) Attorney, Agent, or Firm — WPAT, PC

(57) ABSTRACT

The present invention discloses structures of a planar transformer and a balanced-to-unbalanced transformer. The structure of the planar transformer includes a first planar coil, a second planar coil and a third planar coil. The first planar coil has a first ring structure, a second ring structure, and a connecting section. The first ring structure and the second ring structure are connected by the connecting section. A range of the second planar coil and a range of the first ring structure at least partially overlap. A range of the third planar coil and a range of the second ring structure at least partially overlap. A transformer is constituted by the first planar coil and the second planar coil or by the first planar coil and the third planar coil.

10 Claims, 14 Drawing Sheets

(51) Int. Cl.
*H03H 7/42* (2006.01)
*H01L 23/522* (2006.01)

(58) Field of Classification Search
USPC .................................................. 336/170, 200
See application file for complete search history.

(56) References Cited

U.S. PATENT DOCUMENTS

| | | | | |
|---|---|---|---|---|
| 3,908,364 | A * | 9/1975 | LeFebvre | F02K 9/70 |
| | | | | 102/282 |
| 4,398,149 | A * | 8/1983 | Zens | G01R 33/34069 |
| | | | | 324/300 |
| 6,153,885 | A * | 11/2000 | Kendall | H01J 49/20 |
| | | | | 250/396 ML |
| 6,603,383 | B2 | 8/2003 | Gevorgian et al. | |
| 6,608,364 | B2 * | 8/2003 | Carpentier | H01L 27/08 |
| | | | | 257/528 |
| 6,653,910 | B2 * | 11/2003 | Escalera | H01P 5/10 |
| | | | | 333/25 |
| 6,970,064 | B2 * | 11/2005 | Zhang | H01F 17/0006 |
| | | | | 257/E27.046 |
| 7,642,891 | B2 | 1/2010 | Einzinger et al. | |
| 8,183,971 | B2 | 5/2012 | Le Guillou et al. | |
| 8,198,970 | B2 | 6/2012 | Choi et al. | |
| 8,378,911 | B2 * | 2/2013 | Eray | G06K 19/07749 |
| | | | | 343/788 |
| 8,536,969 | B2 | 9/2013 | Nam et al. | |
| 9,008,603 | B2 * | 4/2015 | Blanchet | H01F 30/04 |
| | | | | 455/292 |
| 9,070,506 | B2 * | 6/2015 | Anderson | H03F 1/0227 |
| 9,196,409 | B2 * | 11/2015 | Nazarian | H01F 5/003 |
| 9,299,764 | B2 | 3/2016 | Mattsson et al. | |
| 9,312,060 | B2 | 4/2016 | Godoy et al. | |
| 9,519,075 | B2 * | 12/2016 | Jachmann | E21B 47/00 |
| 9,543,068 | B2 * | 1/2017 | Aboush | H03L 7/099 |
| 9,843,301 | B1 * | 12/2017 | Rodgers | H01P 3/003 |
| 9,912,307 | B2 * | 3/2018 | Lewis | H03F 3/211 |
| 2008/0204116 | A1 * | 8/2008 | James | G01D 5/208 |
| | | | | 327/517 |
| 2010/0019857 | A1 * | 1/2010 | McMorrow | H03F 1/56 |
| | | | | 333/32 |
| 2010/0060402 | A1 * | 3/2010 | Chen | H03H 7/422 |
| | | | | 336/200 |
| 2011/0148733 | A1 * | 6/2011 | Fahs | H01F 17/0006 |
| | | | | 343/859 |
| 2011/0241163 | A1 * | 10/2011 | Liu | H01L 23/5223 |
| | | | | 257/531 |
| 2012/0044034 | A1 | 2/2012 | Nazarian et al. | |
| 2013/0141203 | A1 * | 6/2013 | Yoon | H01L 23/5227 |
| | | | | 336/170 |
| 2014/0077919 | A1 * | 3/2014 | Godoy | H01F 27/006 |
| | | | | 336/220 |
| 2014/0085001 | A1 * | 3/2014 | Anderson | H03F 1/0227 |
| | | | | 330/197 |
| 2015/0364243 | A1 * | 12/2015 | Yen | H01F 27/2804 |
| | | | | 336/200 |

OTHER PUBLICATIONS

China Patent Office "Office Action" dated Aug. 16, 2018, China. The cited reference 1(CN 104769687 A) anticipates claims 1-2 and 11, and renders claims 3-10, and 12-24 obvious.

* cited by examiner

STRUCTURES OF PLANAR TRANSFORMER AND BALANCED-TO-UNBALANCED TRANSFORMER

BACKGROUND OF THE INVENTION

1. Field of the Invention

The present invention relates to a transformer, especially to a planar transformer and a balanced-to-unbalanced transformer (BALUN).

2. Description of Related Art

A transformer is usually employed in an RF (radio frequency) IC for the purpose of impedance matching for received signals. A transformer inside an IC typically includes planar coils so that impedance matching can be realized by the coupling effects between coils with appropriate turns ratio. In addition to impedance matching, the RF IC in a signal receiving end may also have to convert signals between a common mode and a differential mode. A BALUN is usually utilized in this kind of signal conversion. A BALUN, which is also made of coils in an IC, is one of many applications of a transformer. Therefore, for both transformers and BALUNs, a good design for coils in terms of excellent coupling effects, high quality factor Q and reduced magnetic radiation becomes more and more significant.

SUMMARY OF THE INVENTION

In view of the problems of the prior art, an object of the present invention is to provide a planar transformer and a BALUN that improves the quality factor Q and reduces magnetic radiation, so as to make an improvement to the prior art.

The present invention discloses A planar transformer structure comprising a first planar coil, a second planar coil and a third planar coil. The first planar coil comprises a first ring structure, a second ring structure and a connecting section. The connecting section connects the first ring structure and the second ring structure. A range of the second planar coil partially or entirely overlaps a range of the first ring structure. A range of the third planar coil partially or entirely overlaps a range of the second ring structure. A transformer is constituted by the first planar coil and the second planar coil or by the first planar coil and the third planar coil.

The present invention also discloses A BALUN structure comprising a first planar coil, a second planar coil and a third planar coil. The first planar coil comprises a first ring structure, a second ring structure and a connecting section. The connecting section connects the first ring structure and the second ring structure. A range of the second planar coil partially or entirely overlaps a range of the first ring structure and the second planar coil comprises a first node and a second node. A range of the third planar coil partially or entirely overlaps a range of the second ring structure and the third planar coil comprises a third node and a fourth node. The first node is connected to the third node and the second node is connected to the fourth node.

In comparison with the prior arts, the structures of a planar transformer and a BALUN disclosed in this invention improve symmetry and quality factor Q of inductors as well as enable flexible adjustments of inductance so as to meet the requirements of impedance matching more easily. Moreover, the structures disclosed in this invention also reduce magnetic radiations to protect other components.

These and other objectives of the present invention no doubt becomes obvious to those of ordinary skill in the art after reading the following detailed description of the preferred embodiments that are illustrated in the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 1A:
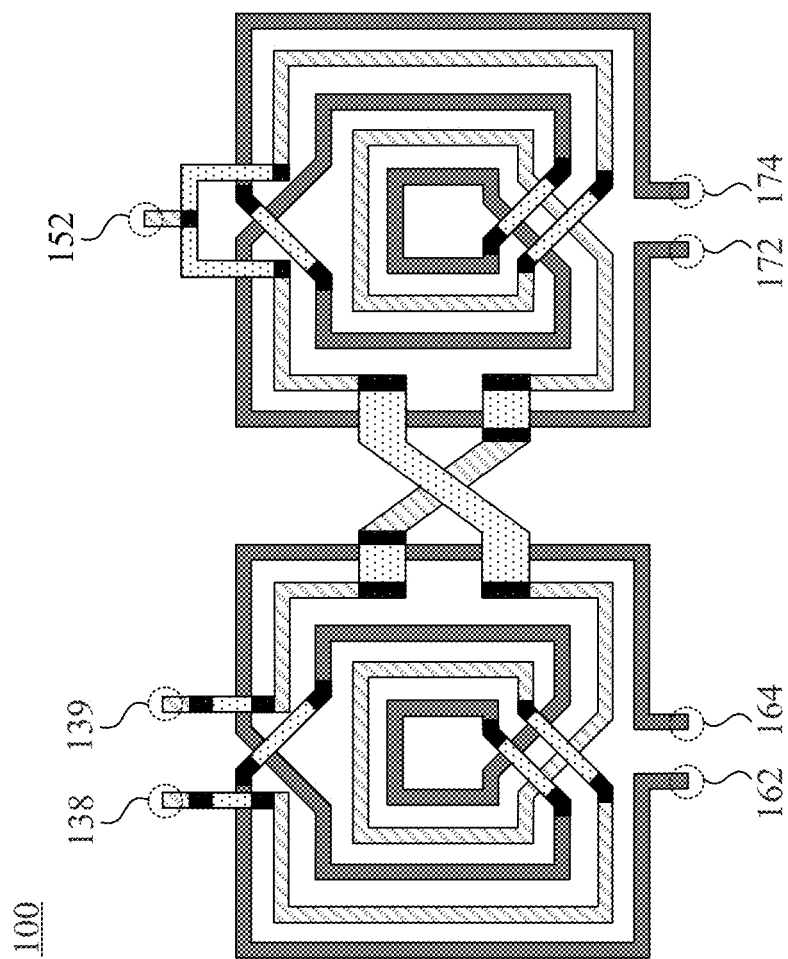
FIG. 1A-1D illustrates a structure of a planar transformer and its equivalent electronic circuit components according to an embodiment of this invention.
Figure 1B:
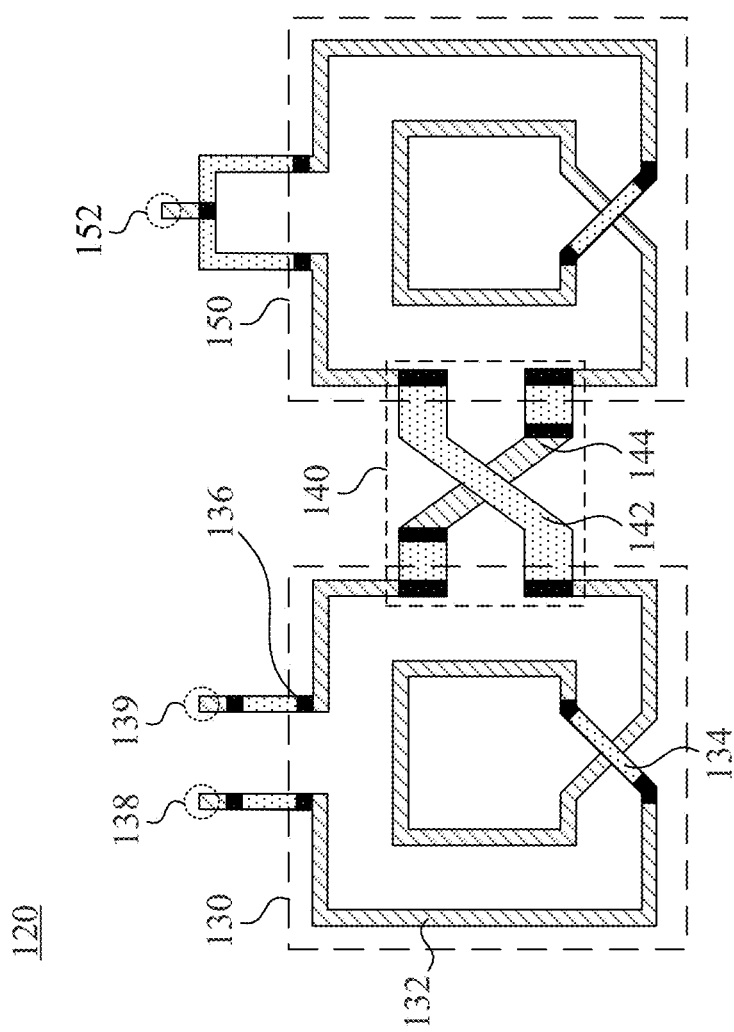

FIGS. 1A-1D illustrate a structure of a planar transformer and its equivalent electronic circuit components according to an embodiment of this invention. The planar transformer 100 in FIG. 1A includes three planar coils. In order to distinctly illustrate the structure of the planar transformer 100, its components are separately presented in FIGS. 1B and 1C. FIG. 1B illustrates one of the three planar coils, the planar coil 120, which includes a ring structure 130, a connecting section 140, and a ring structure 150. The connecting section 140 connects the ring structure 130 and the ring structure 150. The ring structure 130 and the ring structure 150 respectively include metal segments arranged in a two-turn structure. Metal segments in different patterns lie in different metal layers of a semiconductor structure; for example, the metal segment 132 (in stripes) and the metal segment 134 (in dots) can be respectively made in a UTM (Ultra Thick Metal) layer and a RDL (Re-Distribution Layer) of a semiconductor structure, and vice versa. Metal segments in different metal layers are connected through semiconductor structures (in black) perpendicular to the metal segments; for example, a connecting structure 136 is one of the semiconductor structures and can be a via structure. The connecting section 140 is a crossing structure so a current enters the ring structure 130 through a node 138 and flows through most metal segments of the ring structure 130 counterclockwise before entering the ring structure 150 through a metal segment 142; this current then flows clockwise through all the metal segments of the ring structure 150 before flowing back to the ring structure 130 through a metal segment 144 and finally leaves the planar coil 120 through a node 139. Such design makes the current flow in opposite directions in the two ring structures so that magnetic radiations can be reduced as the magnetic fields generated by the ring structure 130 and the ring structure 150 are mutually coupled.

Figure 1C:
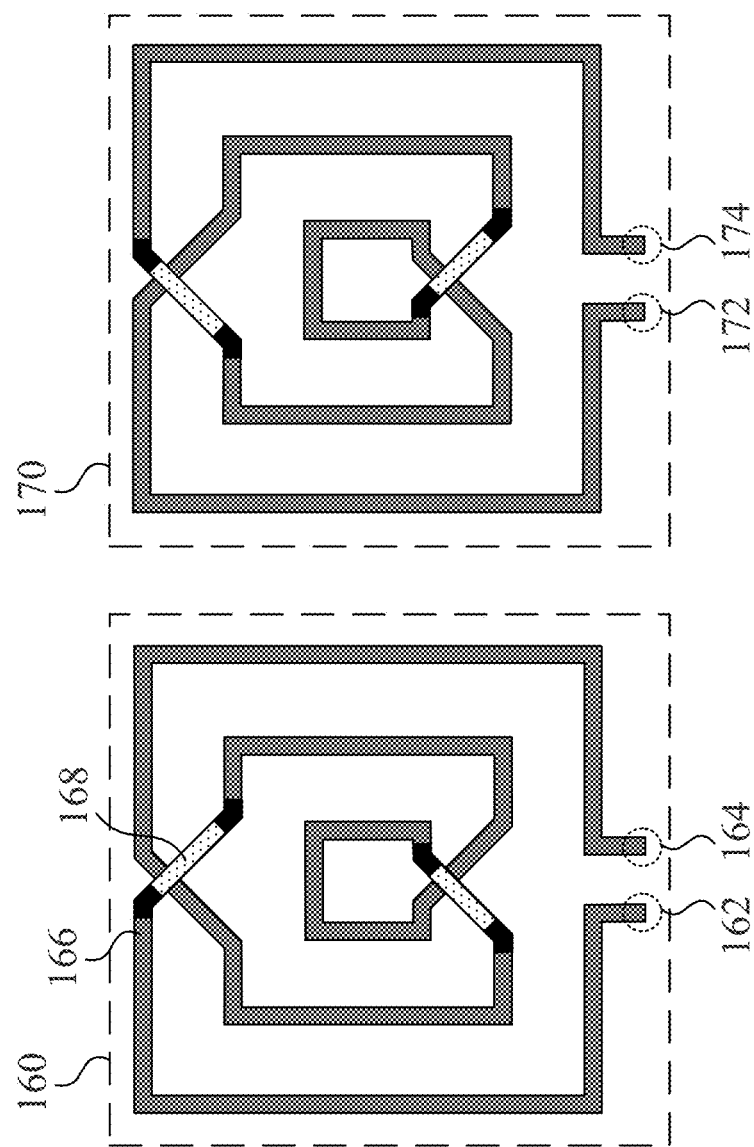
Figure 1D:
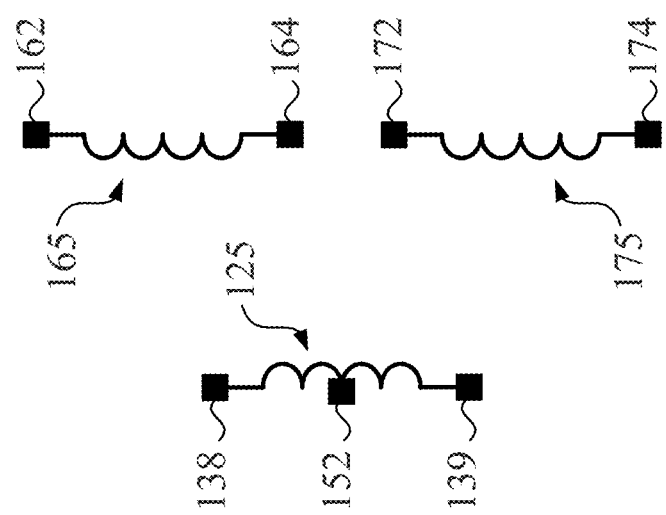

FIG. 1C illustrates the planar coil 160 and the planar coil 170, each including metal segments arranged in a three-turn structure. Similarly, the metal segments in gray such as the metal segment 166 and the metal segments in dots such as the metal segment 168 lie in different metal layers of a semiconductor structure. In one embodiment, the gray metal segments of the planar coil 160 and the planar coil 170 and the striped metal segments of the planar coil 120 are implemented in the same layer of a semiconductor structure; in other embodiments, however, they can be implemented in different layers. The planar coil 160 and the planar coil 170 respectively form a symmetric spiral inductor and the nodes 162 and 164 serve as the two terminals of one inductor and the nodes 172 and 174 server as the two terminals of the other inductor.

The planar transformer 100 shown in FIG. 1A can be obtained by combining the planar coil 120 of FIG. 1B and the planar coil 160 and the planar coil 170 of FIG. 1C. The planar coil 160 is not connected with the planar coil 120 and the planar coil 170 is not connected with the planar coil 120. A range of the planar coil 160 overlaps, at least partially, a range of the ring structure 130, and a range of the planar coil 170 overlaps, at least partially, a range of the ring structure 150. The planar transformer 100 of FIG. 1A can be represented by the electronic circuit components shown in FIG. 1D. The coil 125 represents the planar coil 120, the coil 165 represents the planar coil 160, and the coil 175 represents the planar coil 170. The central node 152 of the coil 125 corresponds to the node 152 in FIG. 1A. These three coils collectively carry out the function of a transformer. Specifically, the coil 125 and the coil 165 together form a transformer and the coil 125 and the coil 175 together form another transformer. In different embodiments, these three coils can also be used as a BALUN.

The three nodes of the coil 125 can be used as balanced terminals of a BALUN; the node 162 of the coil 165 and the node 174 of the coil 175 can be connected to form a first node, the node 164 of the coil 165 and the node 172 of the coil 175 can be connected to form a second node, and the first node and the second node can be used as unbalanced terminals of a BALUN. That is, when this invention is applied to the BALUN, the coil 165 and the coil 175 are connected in parallel. Here is one of the advantages of this structure: when the numbers of turns of the ring structure 130 and the planar coil 160 are close and the numbers of turns of the ring structure 150 and the planar coil 170 are close, the inductance ratios of the planar coil 120 to the planar coil 160 and to the planar coil 170 can be adjusted by connecting the planar coil 160 and the planar coil 170 in parallel to adjust impedance matching. In addition, impedance matching can also be adjusted by connecting one or more capacitors in parallel to any input/output terminal set.

Figure 2A:
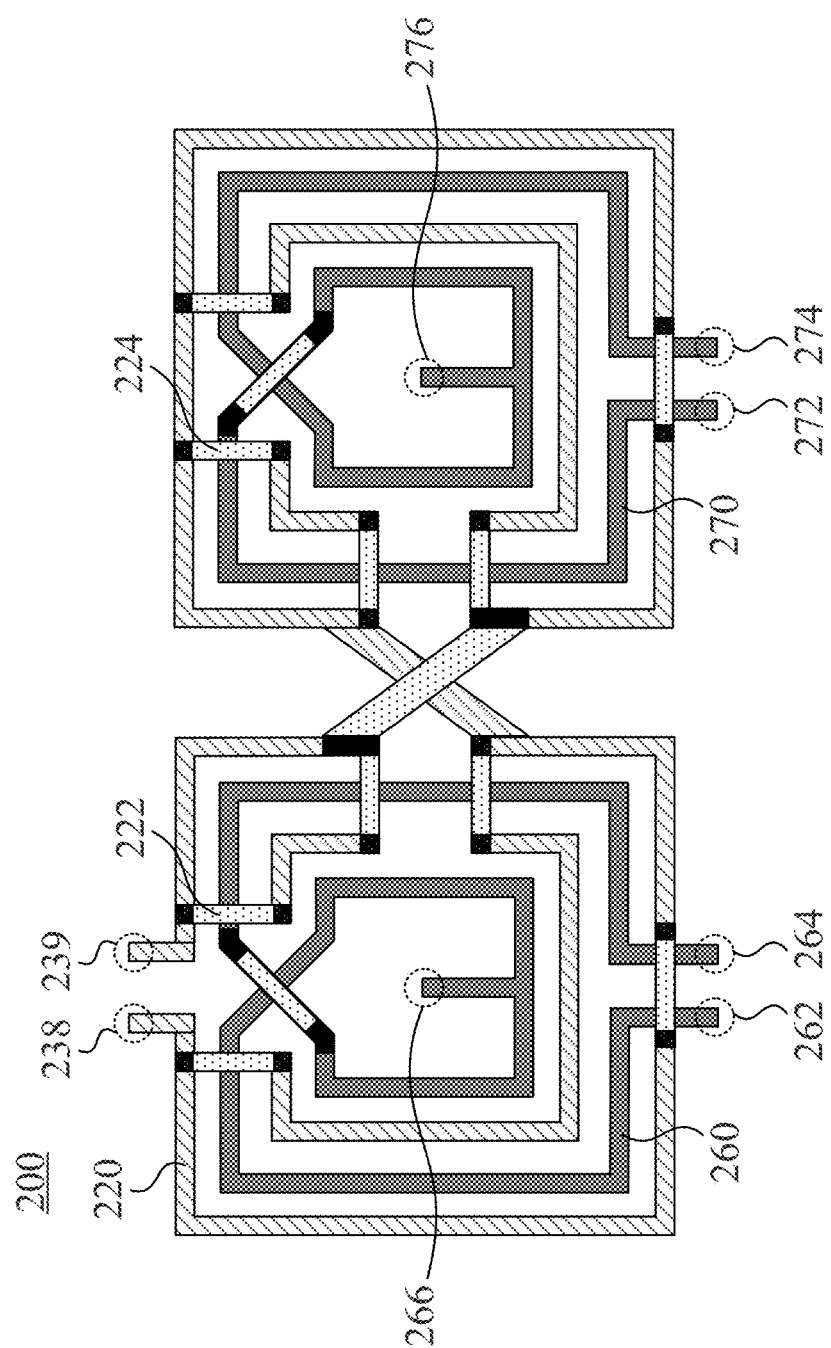
FIG. 2A-2B illustrate a structure of a planar transformer and its equivalent electronic circuit components according to another embodiment of this invention.
Figure 2B:
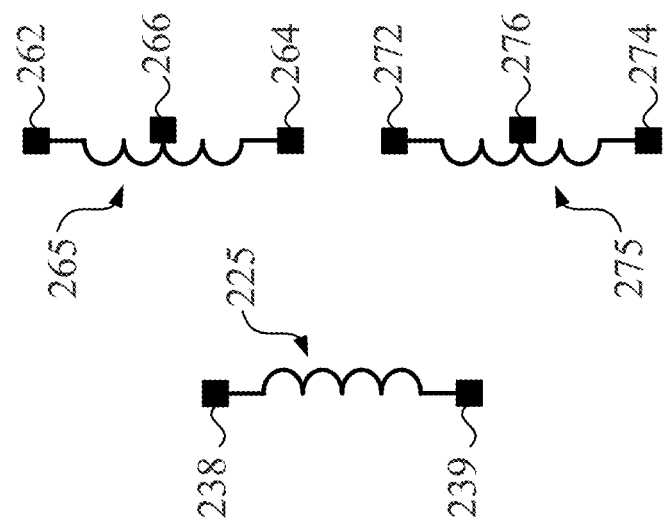

FIGS. 2A and 2B illustrate a structure of a planar transformer and its equivalent electronic circuit components according another embodiment of this invention. The planar transformer 200 includes three planar coils as well, which are a planar coil 220 with a node 238 and a node 239, a planar coil 260 with a node 262 and a node 264, and a planar coil 270 with a node 272 and a node 274. Similar to the planar coil 120, the planar coil 220 is made up of two ring structures and a connecting section. The connecting section connects the two ring structures. The connecting section is also a crossing structure so the two ring structures have opposite current directions, which reduces the magnetic radiations of the planar coil 220. The planar coil 260 and the planar coil 270 are also symmetric spiral inductors. The planar coil 260 further includes a central tap 266 and the planar coil 270 further includes a central tap 276.

The planar transformer 200 of FIG. 2A can be represented by the electronic circuit components shown in FIG. 2B. The coil 225 represents the planar coil 220, the coil 265 represents the planar coil 260, and the coil 275 represents the planar coil 270. These three coils can carry out the function of a transformer. Specifically, the coil 225 and the coil 265 form a transformer, and the coil 225 and the coil 275 form another transformer. In a different embodiment, these three coils can also be used as a BALUN. The two nodes of the coil 225 can be used as the unbalanced terminals of a BALUN. The nodes 262, 264 and 266 of the coil 265 are connected with the nodes 274, 272 and 276 of the coil 275, respectively, so a new coil comprising the coil 265 and the coil 275 connected in parallel is formed. The three nodes of the new coil can be used as the balanced terminals of the BALUN. Similarly, an inductance ratio of the planar coil 220 to the planar coil 260 and an inductance ratio of the planar coil 220 to the planar coil 270 can be adjusted by connecting coils in parallel to further adjust impedance matching. In addition, this embodiment also implements bridging metal segments, such as a bridging metal segment 222 and a bridging metal segment 224, on the planar coil 220 to connect an outer turn and an inner turn of each ring structure of the planar coil 220. When the outer turn and the inner turn of the planar coil 220 are connected by the bridging metal segments, the inductance of the planar coil 220 decreases. In other words, this embodiment further adjusts impedance matching by introducing bridging metal segments. The two ends of the bridging metal segment 222 or the bridging metal segment 224 connect a part of the metal segments of the planar coil 220, respectively, and the metal segments connected by the bridging metal segment 222 or the bridging metal segment 224 are basically parallel and there is (are) metal segment(s) of other electronic circuit components between the metal segments connected by the bridging metal segment 222 or the bridging metal segment 224. For example, the metal segments connected by the two ends of the bridging metal segment 222 are metal segments of the planar coil 220 and the metal segment between the connected metal segments is a metal segment of the planar coil 260. The metal segments of the planar coil 260 do not connect the bridging metal segment 222 and the metal segments of the planar coil 220. Note that the bridging metal segment 222 and the bridging metal segment 224 are merely taken as examples for the description of this embodiment; the planar coil 220 may include all the bridging metal segments in FIG. 2A or even more.

Figure 3:
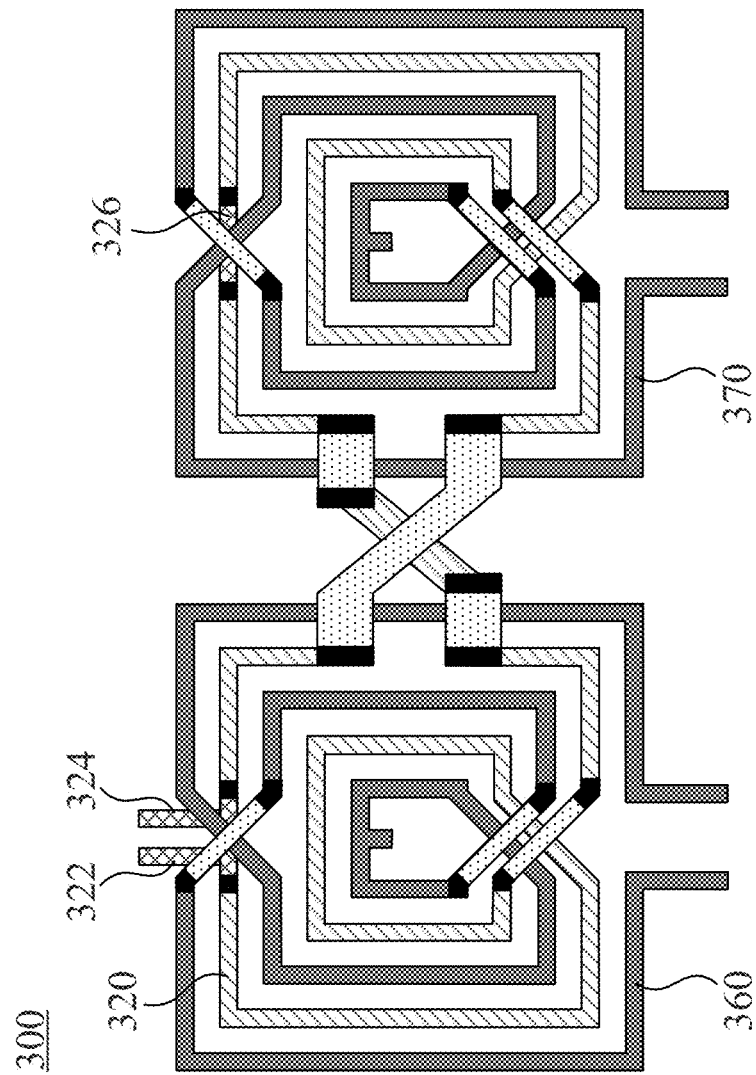
FIG. 3 illustrates a structure of a planar transformer according to another embodiment of this invention.

FIG. 3 illustrates a structure of a planar transformer according to another embodiment of this invention. The structure of FIG. 3 is similar to the structure of FIG. 2A. The planar coil 320 has 2 nodes whereas each of the planar coil 360 and the planar coil 370 has 3 nodes; therefore the equivalent electronic circuit components of the structure of FIG. 3 are similar to that of FIG. 2B. When the structure of FIG. 3 is applied to a BALUN, the planar coil 320 can be used as the unbalanced terminals and the planar coil 360 and the planar coil 370 are connected in parallel to serve as the balanced terminals. As opposed to the embodiment of FIG. 2A, the planar transformer 300 does not include any bridging metal segments but includes metal segments on a third metal layer, i.e., the metal segments 322, 324 and 326. The third metal layer is different from the metal layer to which the striped metal segments and the gray metal segment belong and from the metal layer to which the dotted metal segment belong. Further, in the embodiment of FIG. 2A, the outermost turn of the coil with 3 nodes (i.e., the planar coil 260 and the planar coil 270) locates inside the outermost turn of the coil with 2 nodes (i.e., the planar coil 220); however, FIG. 3A presents an alternative embodiment.

Figure 4:
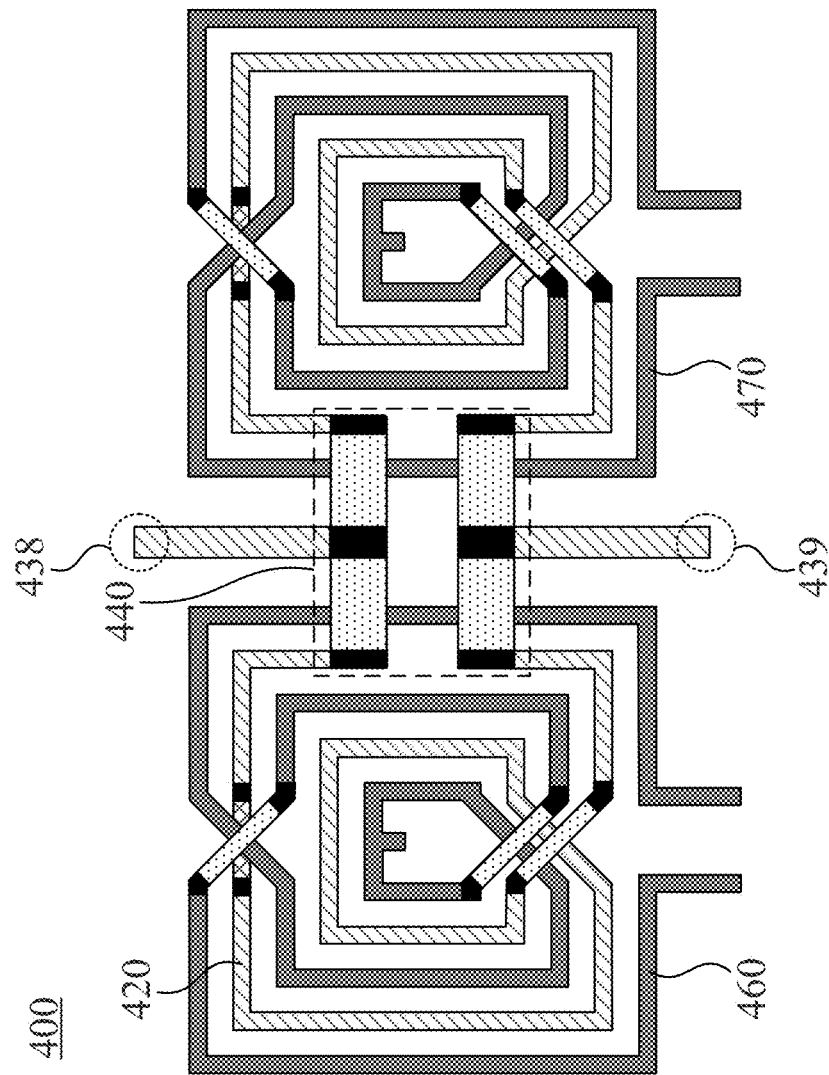
FIG. 4 illustrates a structure of a planar transformer according to another embodiment of this invention.

FIG. 4 illustrates a structure of a planar transformer according to another embodiment of this invention. The planar coil 420, the planar coil 460 and the planar coil 470 of the planar transformer 400 are arranged in a way similar to the structure of the embodiment shown in FIG. 3, differentiating in that the planar coil 420 is not directly connected with its nodes 438 and 439. The nodes 438 and 439 are directly connected to a connecting section 440 and further connected to the planar coil 420 through the connecting section 440. The symmetry of the planar coil 420 can be improved by setting the nodes 438 and 439 in the middle part of the planar coil 420; in other words, the two ring structures of the planar coil 420 are symmetric to each other with respect to an axis of symmetry that passes the nodes 438 and 439. Rather than a crossing structure, the connecting section 440 is made of two metal segments that do not cross. The currents still flow in opposite directions in these two ring structures so the planar coil 420 of such design not only improves the symmetry but suppresses magnetic field radiation more effectively. According to practical experiments, an improvement to the symmetry helps enhance the quality factor Q of the planar coil 420.

Figure 5:
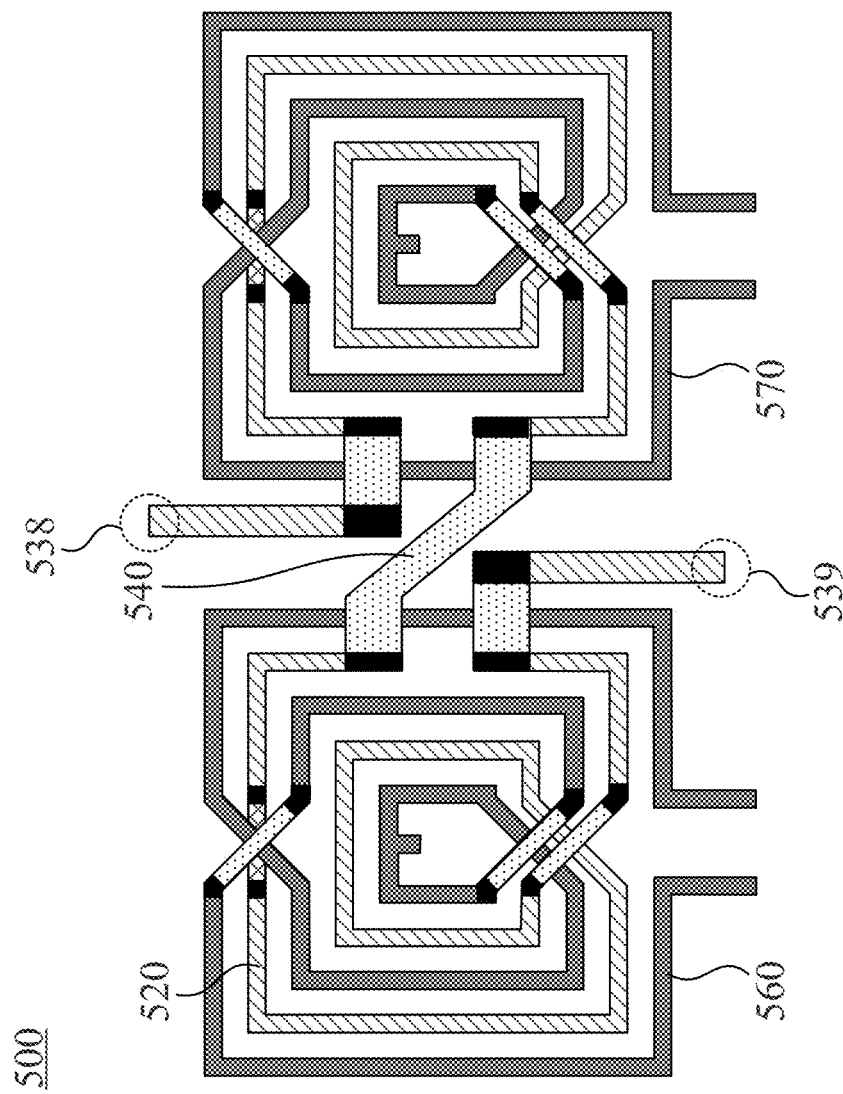
FIG. 5 illustrates a structure of a planar transformer according another embodiment of this invention.

FIG. 5 illustrates a structure of a planar transformer according another embodiment of this invention. The planar coil 520, the planar coil 560 and the planar coil 570 of the planar transformer 500 are arranged in a way similar to the structure of the embodiment of FIG. 4, with the nodes 538 and 539 of the planar coil 520 also set in the middle part of the planar coil 520 to improve the symmetry and the quality factor Q of the planar coil 520. Rather than through a connecting section 540, the node 538 is directly connected to one ring structure of the planar coil 520 whereas the node 539 is directly connected to the other ring structure of the planar coil 520. In this embodiment, the planar coil 520 can also prevent magnetic radiation because the currents flow in opposite directions in these two ring structures. In this embodiment, after a current enters the planar coil 520 from one of the two nodes 538 and 539, the current flows through the entire structure of one of the two ring structures before flowing into the other through the connecting section 540. The time difference of the current flowing sequentially in the two ring structures enables the magnetic field generated by the first ring structure to couple smoothly with the magnetic field generated by the second ring structure. According to practical experiments, an improvement in magnetic coupling effects helps improve the quality factor Q of the planar coil 560 and the planar coil 570. Therefore, the embodiment of FIG. 5, as opposed to the embodiment of FIG. 4, improves both the symmetry and the quality factor Q.

Figure 6:
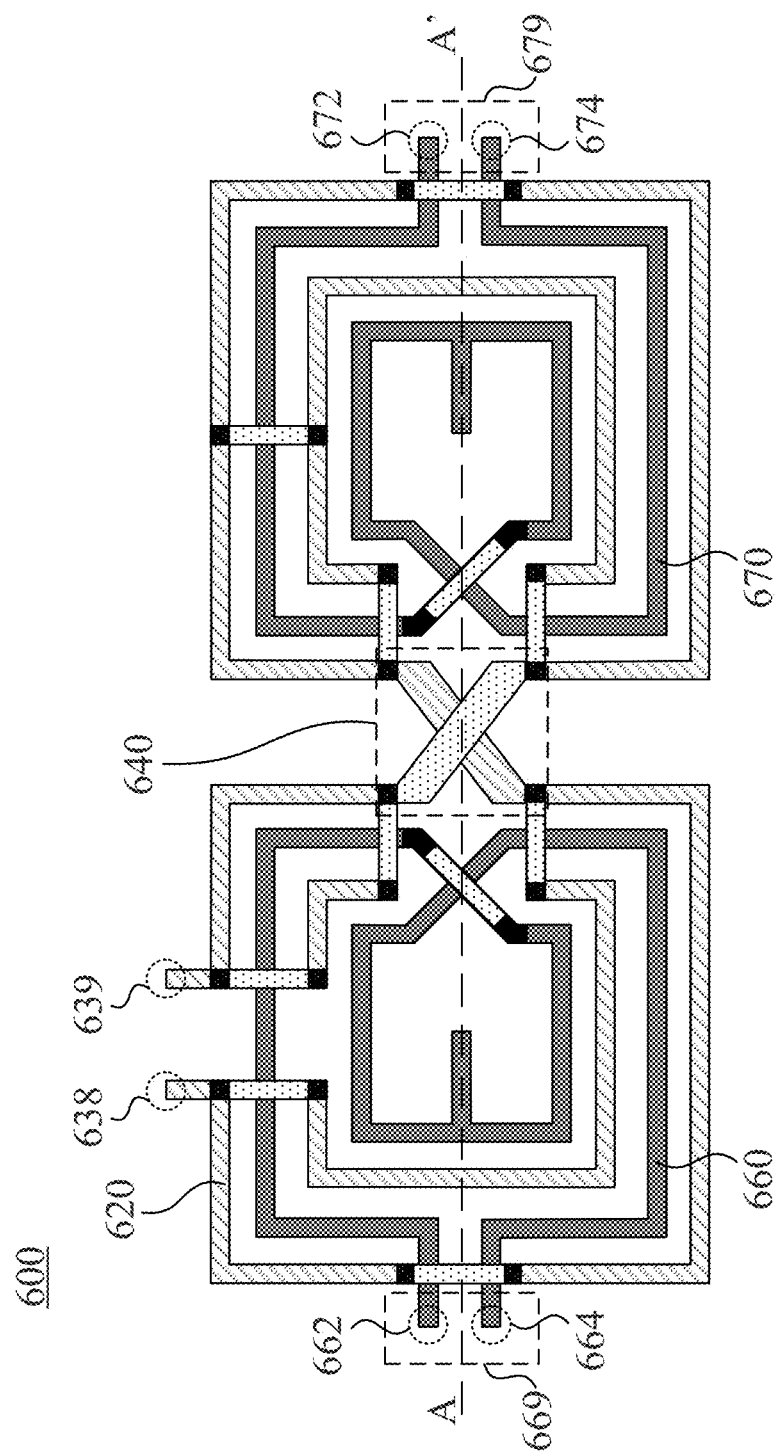
FIG. 6 illustrates a structure of a planar transformer according to another embodiment of this invention.

FIG. 6 illustrates a structure of a planar transformer according to another embodiment of this invention. The planar transformer 600 includes a planar coil 620, a planar coil 660 and a planar coil 670. The nodes 662 and 664 of the planar coil 660 form a port 669, and the nodes 672 and 674 of the planar coil 670 form a port 679. The port 669 (i.e., the opening of the planar coil 660) and the port 679 (i.e., the opening of the planar coil 670) face opposite directions, away from the connecting section 640. A line connecting the port 669 and the port 679 forms an axis of symmetry A-A', and the planar coil 660 is symmetry with respect to the axis of symmetry A-A', so is the planar coil 670. Such design makes the planar coil 660 and the planar coil 670 have better symmetry, which accounts for a better magnetic coupling effect between the planar coil 660 and the planar coil 670 near the connecting section 640. The magnetic coupling effect is symmetric (with respect to the axis of symmetry A-A') for both the planar coil 660 and the planar coil 670, and a more symmetric magnetic coupling effect helps improve the quality factor Q. In this embodiment, the node 638 and the node 639 of the planar coil 620 are disposed on one of the two ring structures of the planar coil 620; in other embodiments, however, the node 638 and the node 639 can be disposed in the middle part of the planar coil 620, as illustrated in FIGS. 4 and 5.

Figure 7:
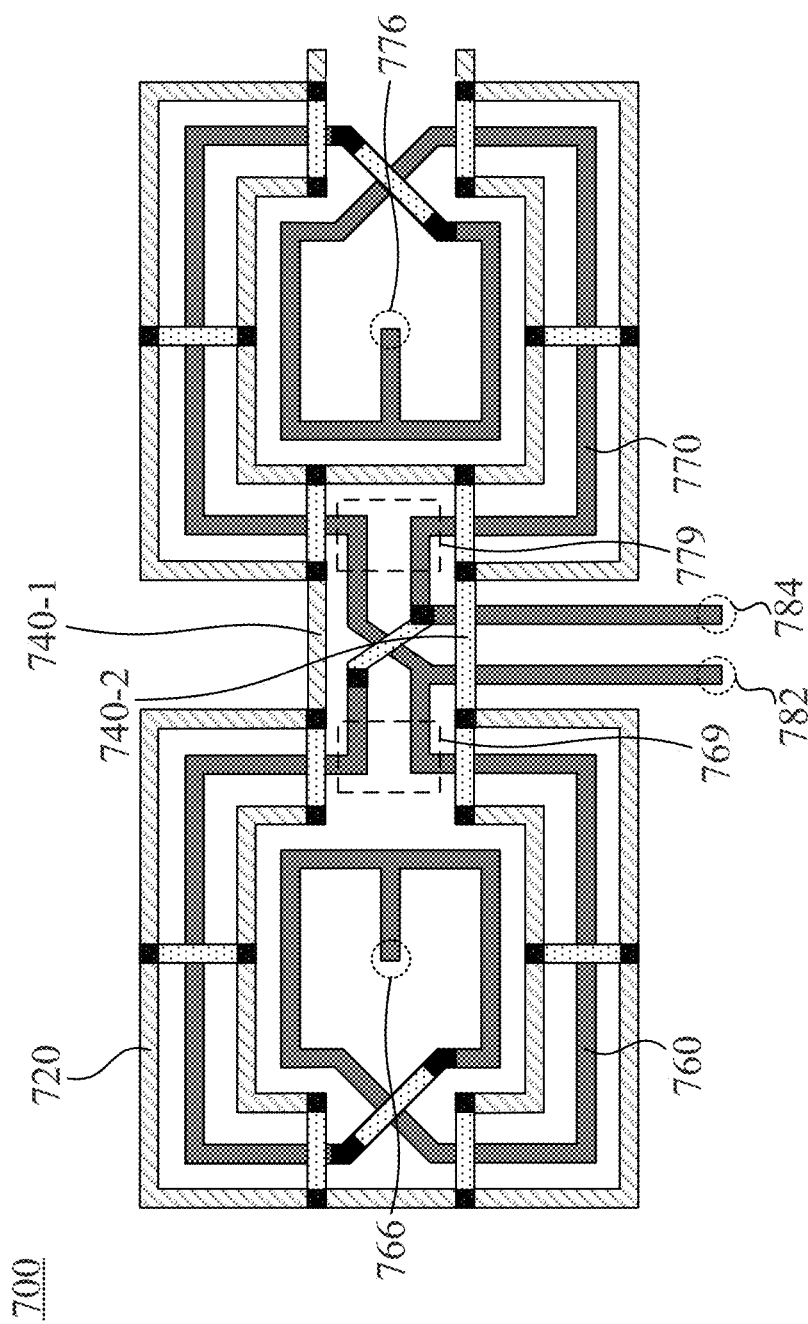
FIG. 7 illustrates a structure of a BALUN according to another embodiment of this invention.

FIG. 7 illustrates a structure of a BALUN according to another embodiment of this invention. The BALUN 700 includes a planar coil 720, a planar coil 760 and a planar coil 770. The opening of the planar coil 760 (i.e., the port 769 of the planar coil 760, comprising the two nodes of the planar coil 760) and the opening of the planar coil 770 (i.e., the port 779 of the planar coil 770, comprising the two nodes of the planar coil 770) face the connecting section 740, which comprises the metal segment 740-1 and the metal segment 740-2. Similarly, a line connecting the port 769 and the port 779 forms an axis of symmetry (not shown), and the planar coil 760 and the planar coil 770 are symmetric with respect to this axis of symmetry, respectively. A node 782 is formed by connecting one node of the planar coil 760 and one node of the planar coil 770, and a node 784 is formed by connecting the other node of the planar coil 760 and the other node of the planar coil 770. In addition, the central tap 766 of the planar coil 760 can be connected with the central tap 776 of the planar coil 770. In such arrangement, the planar coil 760 and the planar coil 770 are connected in parallel; as a result, the planar coil 720 forms the unbalanced terminal of the BALUN 700 and the planar coil 760 and the planar coil 770, connected in parallel, form the balanced terminal of the BALUN 700.

Figure 8:
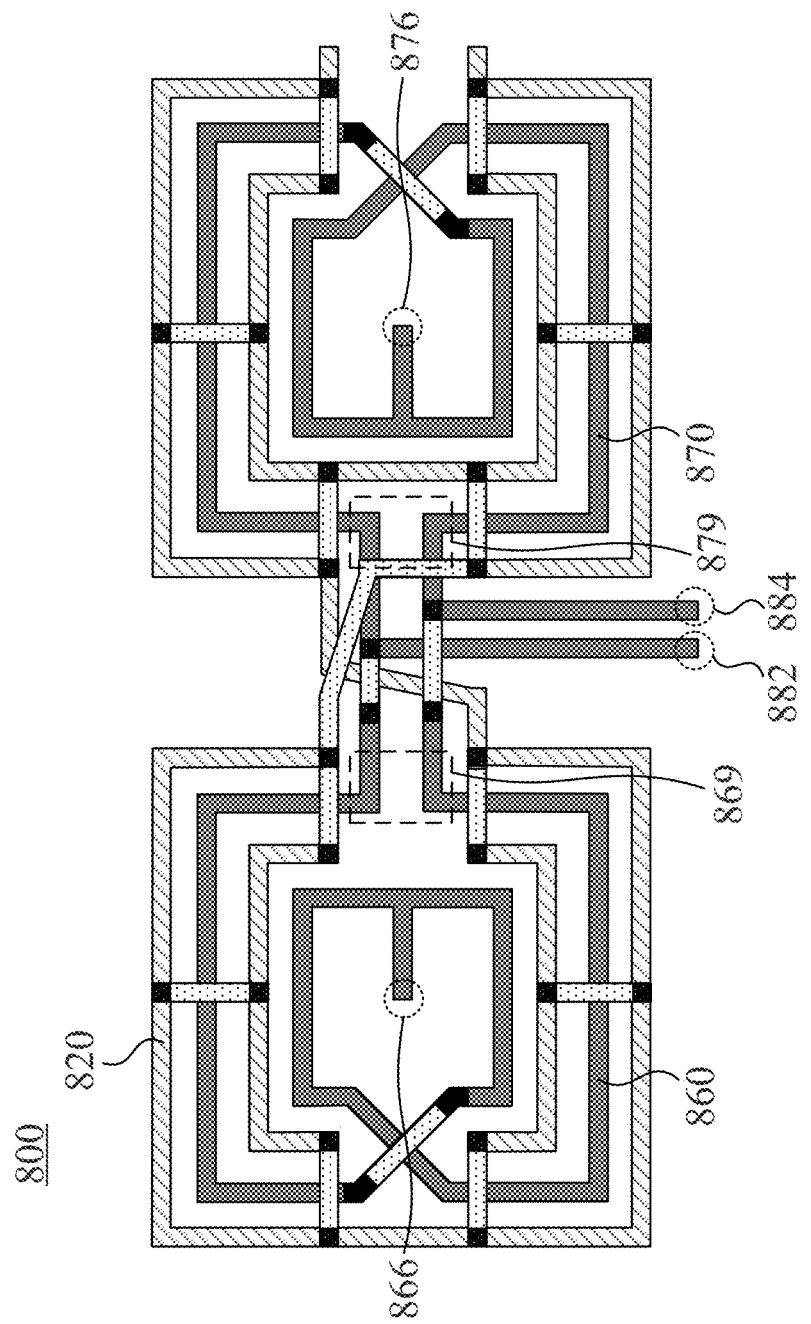
FIG. 8 illustrates a structure of a BALUN according to another embodiment of this invention.

FIG. 8 illustrates a structure of a BALUN according to another embodiment of this invention. The BALUN 800 includes a planar coil 820, a planar coil 860 and a planar coil 870. The opening of the planar coil 860 (i.e., the port 869 of the planar coil 860, comprising the two nodes of the planar coil 860) and the opening of the planar coil 870 (i.e., the port 879 of the planar coil 870, comprising the two nodes of the planar coil 870) face the connecting section of the planar coil 820. The connecting section of the planar coil 820 is a crossing structure, which is different from the structure of the connecting section 740 of FIG. 7. A line connecting the port 869 and the port 879 forms an axis of symmetry (not shown), and the planar coil 860 and the planar coil 870 are symmetric with respect to this axis of symmetry, respectively. A node 882 is formed by connecting one node of the planar coil 860 and one node of the planar coil 870, and a node 884 is formed by connecting the other node of the planar coil 860 and the other node of the planar coil 870. In addition, the central tap 866 of the planar coil 860 can be connected with the central tap 876 of the planar coil 870. In such arrangement, the planar coil 860 and the planar coil 870 are connected in parallel; as a result, the planar coil 820 forms the unbalanced terminal of the BALUN 800 and the planar coil 860 and the planar coil 870, connected in parallel, form the balanced terminal of the BALUN 800.

Figure 9:
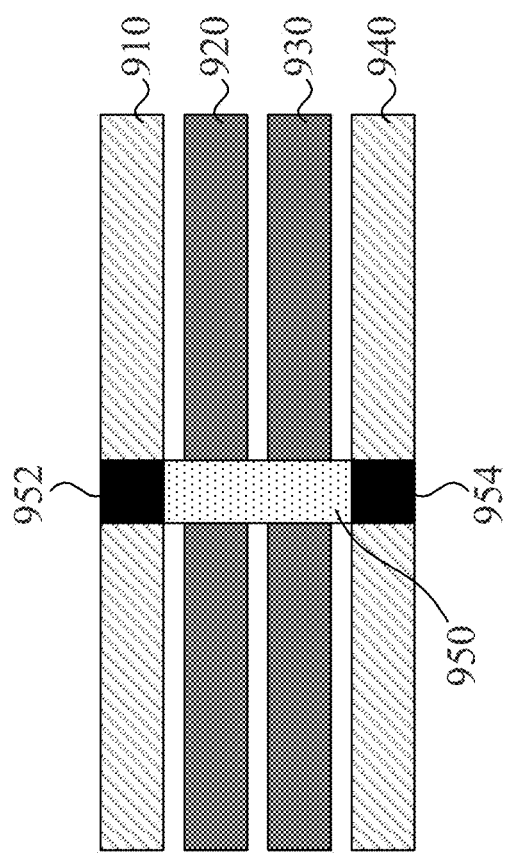
FIG. 9 illustrates a structure that can be used to increase the inductance value of a planar coil according to an embodiment of this invention.

When it is necessary to adjust the inductance values of the planar coils of a transformer or a BALUN to meet the impedance matching requirements, the metal segments of the same planar coil can be arranged side by side to improve mutual inductances among the metal segments, thereby increasing the inductance value of this particular planar coil. FIG. 9 illustrates a structure that can be used to increase the inductance value of a planar coil according to an embodiment of this invention. FIG. 9 shows partial structures of two planar coils. The two planar coils at least partially overlap each other. The metal segment 910 and the metal segment 940 belong to one planar coil and the metal segment 920 and the metal segment 930 belong to the other planar coil. The metal segment 920 and the metal segment 930 are arranged side by side with no metal segments of another planar coil in between, so the metal segment 920 and the metal segment 930 have good mutual inductance, which is good for the improvement of the inductance value of the planar coil to which the metal segment 920 and the metal segment 930 belong. Further, one end of the bridging metal segment 950 is connected to the metal segment 910 through the connecting structure 952, whereas the other end is connected to the metal segment 940 through the connecting structure 954. The middle part of the bridging metal segment 950 overlaps (without contact) the metal segments not belonging to the planar coil the bridging metal segment 950 connects; that is, the metal segment 920 and the metal segment 930 are not connected with the metal segment 910 and the metal segment 940. With the connection of the bridging metal segment 950, the inductance value of the planar coil to which the metal segment 910 and the metal segment 940 belong will decrease. The design of FIG. 9 can be employed to enlarge the difference between the inductance values of two planar coils for the purpose of impedance matching adjustment.

Figure 10:
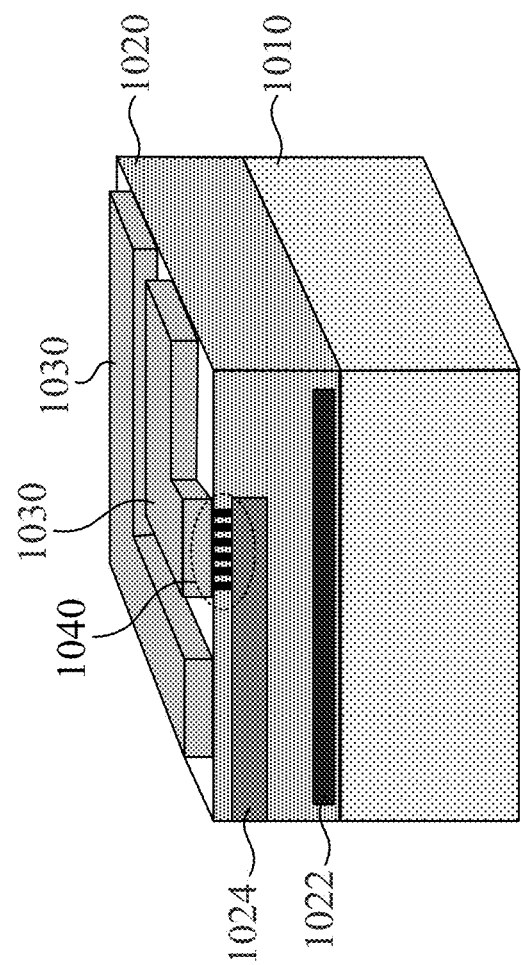
FIG. 10 illustrates a cross-sectional view of a transformer or a BALUN of this invention.

FIG. 10 illustrates a cross-sectional view of a transformer or a BALUN of this invention. An oxide layer 1020 is fabricated on the substrate 1010, and the oxide layer 1020 includes a pattern-ground shielding layer 1022 and a metal layer 1024. Another metal layer 1030 is fabricated on the oxide layer 1020. The metal layer 1024 can be the UTM layer and the metal layer 1030 can be the RDL of a semiconductor. In the above embodiments, the gray and striped metal segments can be implemented at the same layer whereas the dotted metal segments (including the bridging metal segments) can be implemented at another metal layer. In other words, most metal segments of these three planar coils are implemented at the same metal layer. In an alternative embodiment, however, at least one of these three planar coils can be implemented at a different metal layer. Even if the planar coil of a spiral inductor and the planar coil with two ring structures are implemented at different metal layers, the two planar coils still partially or entirely overlap. The pattern-ground shielding layer 1022 is able to prevent substrate loss between a planar coil and the substrate 1010, which may cause the quality factor Q of the planar coil to decrease. The connecting structure 1040 corresponds to the black connecting structures in FIGS. 1-9, such as the connecting structure 136, the connecting structure 952 and the connecting structure 954. Note that even if these three planar coils are implemented at both the metal layer 1024 and the metal layer 1030, rather than only one of them, this invention can still use other metal layers in the oxide layer 1020 (not shown) to implement the bridging metal segments.

Despite the fact that the planar coils and the ring structures in the above embodiments are exemplified in rectangles, they can be alternatively implemented in other polygons or circles. In addition, the number of turns of the planar coils are not limited to the above embodiments. Please note that the shape, size, and ratio of any element and the step sequence of any flow chart in the disclosed figures are just exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A planar transformer structure comprising:
   a first planar coil comprising a first ring structure, a second ring structure and a connecting section, wherein the connecting section connects the first ring structure and the second ring structure;
   a second symmetric planar coil having at least two turns, wherein a range of the second symmetric planar coil partially or entirely overlaps a range of the first ring structure, and an outmost turn of the first ring structure is arranged inside an outmost turn of the second symmetric planar coil; and
   a third symmetric planar coil having at least two turns, wherein a range of the third symmetric planar coil partially or entirely overlaps a range of the second ring structure, and an outmost turn of the second ring structure is arranged inside an outmost turn of the third symmetric planar coil;
   wherein, a transformer is constituted by the first planar coil and the second planar coil or by the first planar coil and the third planar coil;
   wherein a current entering the first ring structure flows through all metal segments of the first ring structure before leaving the first ring structure;
   wherein the current flowing in the first ring structure is opposite in direction to a current flowing in the second ring structure.

2. The planar transformer structure of claim 1, wherein an outermost turn of the first planar coil is arranged outside the second planar coil or the third planar coil.

3. The planar transformer structure of claim 1, wherein the first planar coil comprises a first node and a second node, which are directly connected to the connecting section.

4. The planar transformer structure of claim 1, wherein the first planar coil comprises a first node and a second node, which locate in a middle part of the first planar coil with the first node directly connected to the first ring structure and the second node directly connected to the second ring structure.

5. The planar transformer structure of claim 1, wherein the second planar coil comprises a first node and a second node, which form a first port, and the third planar coil comprises a third node and a fourth node, which form a second port, and the second planar coil and the third planar coil are respectively symmetric with respect to an axis of symmetry passing the first port and the second port.

6. The planar transformer structure of claim 1, wherein the second planar coil and the third planar coil are at the same layer of the first planar coil.

7. The planar transformer structure of claim 1, wherein at least one of the second planar coil and the third planar coil is at a different layer from the first planar coil.

8. The planar transformer structure of claim 1 further comprising:
- a bridging metal segment, two ends of which connect first metal segments of one of the first ring structure, the second ring structure, the second planar coil and the third planar coil, and a middle part of which overlaps a second metal segment which is not connected with the first metal segments.

9. The planar transformer structure of claim 1, wherein at least two metal segments of one of the first ring structure, the second ring structure, the second planar coil and the third planar coil are arranged side by side and no other metal segments are located between the two metal segments.

10. The planar transformer structure of claim 1 further comprising:
- a substrate; and
- a pattern-ground shielding layer implemented between the substrate and the first planar coil, the second planar coil and the third planar coil.

* * * * *